Sept. 5, 1961 D. D. KETCHUM 2,999,171

REGENERATIVE TRANSISTOR PULSE AMPLIFIER

Filed Nov. 12, 1957

INVENTOR.
DAVID D. KETCHUM
BY Wade Koontz
ATTORNEY and
Richard J. Kilner
AGENT

United States Patent Office 2,999,171

Patented Sept. 5, 1961

2,999,171

REGENERATIVE TRANSISTOR PULSE AMPLIFIER

David D. Ketchum, Falmouth, Mass., assignor to the United States of America as represented by the Secretary of the Air Force Filed Nov. 12, 1957, Ser. No. 695,998
3 Claims. (Cl. 307—88.5)
(Granted under Title 35, U.S. Code (1952), sec. 266)

The invention described herein may be manufactured and used by or for the United States Government for governmental purposes without payment to me of any royalty thereon.

This invention relates to a point-contact transistor regenerative pulse amplifier which when triggered by a narrow positive pulse of suitable amplitude develops across its collector load resistor a negative-going pulse of width and amplitude as determined by the circuit parameters.

One object of the invention is to provide a device for producing negative-going output pulses directly without using a polarity inverting transformer with an amplifier for producing positive-going pulses.

Another object is to provide a device which will produce a negative-going output pulse wherein the duration of the pulse can be controlled by the selection of the proper parameters.

Figure 1:
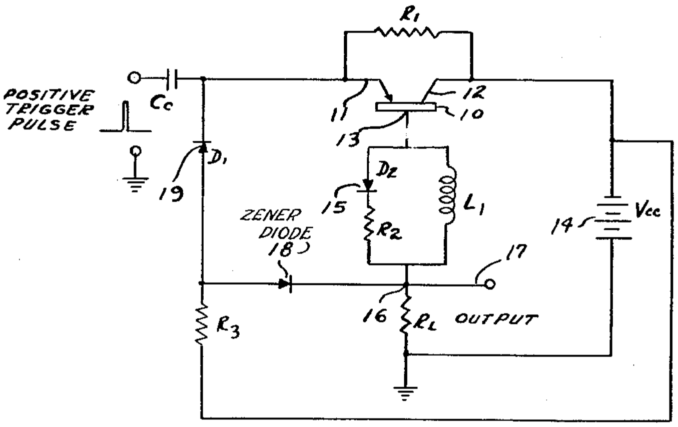
Figure 2:
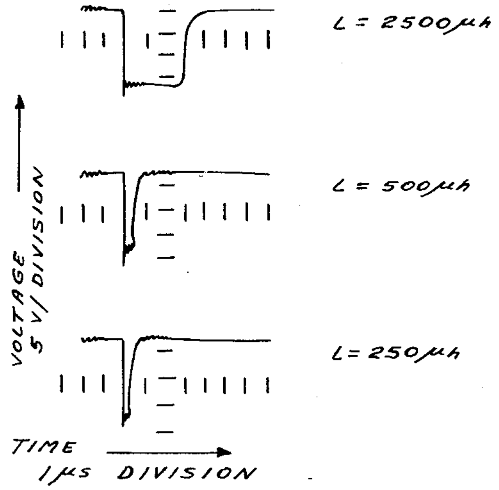

These and other objects will be best understood from the following detailed description taken in connection with the drawings wherein:

FIG. 1 is a circuit schematic of a negative pulse producing circuit according to one embodiment of the invention; and FIG. 2 is an illustration showing the pulse duration in the output of the circuit of FIG. 1 for various values for the inductance in the base circuit of the transistor.

Referring more particularly to FIG. 1 a regenerative transistor negative pulse producing amplifier is illustrated having a point-contact transistor 10. The transistor has an emitter 11, a collector 12 and a base electrode 13. A battery 14 is connected between the collector 12 and a load $R_L$ with the positive terminal of the battery being connected to one end of load $R_L$ and also to ground and the negative terminal being connected to the collector 12. An inductive device $L_1$ shunted by a diode 15 and a resistance $R_2$ is connected in the base circuit of transistor 10 with one end of the inductance being connected to the base electrode and the other end being connected to the end of load resistor $R_L$ opposite that which is connected to ground. An output lead 17 is connected to the junction of inductance $L_1$ and $R_L$ at a point 16. A silicon diode 18 has one end connected to point 16 and the other end connected to emitter 11 through a diode 19. Diode 18 is reversed by the application of the voltage of battery 14 across it through resistance $R_3$. Since the voltage of battery 14 is much larger than the breakdown voltage of diode 18 the diode breaks down and becomes a low resistance. This is what is known as the "zener effect" which is analogous from a circuit standpoint to the breakdown of a gas tube except that the breakdown voltage for diodes of this type extends down to the neighborhood of 3 volts. $R_3$ is made very large as compared to the resistance of diode 18 in the "zener" region so that a nearly constant drop equal to the breakdown voltage is maintained across this diode. This voltage is approximately 3 volts for the diode used in this device. The shunting effect of $R_3$ on the output impedance can be made negligible by making $R_3$ very large as compared with the resistance of the load $R_L$. The emitter biasing voltage across diode 18 is applied to the emitter 11 through diode 19 since battery 14 holds the diode 19 conducting through the resistor $R_1$.

In the operation of the device of FIG. 1 a positive pulse of sufficient magnitude to cause the transistor to go into saturation is applied to the emitter 11 of transistor 10. The large increase in the collector current through the load $R_L$ causes a negative-going signal to appear at the output 17. Since the current through the inductance $L_1$ cannot change instantaneously the base of transistor 10 is held negative with respect to the emitter and this holds the transistor in saturation even after the positive pulse has been removed. When the current through the inductance $L_1$ reverses, the emitter to base voltage is driven negative, thereby causing the transistor to come out of saturation and to be turned off. The diode 15 then starts to conduct and thereby prevents ringing that might occur due to stray capacity in the circuit.

The duration of the negative pulse at output 17 is determined by the circuit parameters and can be controlled to any desired pulse width by selecting the values for the circuit parameters, as for example, the value for the inductance $L_1$ as shown by the wave forms in FIG. 2.

There is thus provided a device for producing a negative-going output pulse which makes the use of a polarity-inverting transformer unnecessary and in which the duration of the pulse can be controlled by varying the circuit parameters.

While one embodiment has been described in some detail it is obvious that numerous changes may be made without departing from the general principles and scope of the invention.

I claim:

1. A negative pulse producing circuit comprising; a point contact transistor having an emitter, a collector and a base electrode, an inductive device connected in the base circuit of said transistor, a damping diode connected in shunt with said inductance, with its low resistance direction being in the direction away from said base electrode, a low impedance load connected in the collector circuit outside of the base emitter circuit of said transistor, means connected between said collector and said load for applying a negative voltage to said collector, means for applying a negative bias to said emitter, means for applying a positive trigger pulse to said emitter to drive the transistor into saturation and an output means connected to the end of the load impedance opposite that which the voltage source is connected.

2. A negative pulse producing circuit comprising; a point contact transistor having an emitter, a collector and a base electrode, an inductive device connected in the base circuit of said transistor, a damping diode connected in shunt with said inductance, with its low resistance direction being in the direction away from said base electrode, means connected in parallel with said inductive device to prevent oscillations, a low impedance load connected in the collector circuit outside of the base emitter circuit of said transistor and having one end connected to one end of said inductive device, means connected between said collector and said load for applying a negative voltage to said collector, means for applying a negative bias to said emitter, means for applying a positive trigger pulse to said emitter to drive said transistor into saturation and output means connected to the junction between said load and said inductive device.

3. A device for producing a negative pulse in response to a positive trigger comprising; a point contact transistor having an emitter, a collector and a base electrode, an inductive device connected in the base circuit of said transistor, a damping diode connected in shunt with said inductance, with its low resistance direction being in the direction away from said base electrode, means connected in parallel with said inductive device to prevent oscillations, a low impedance load connected in the collector circuit outside of the base emitter circuit of said transistor with one end of said load being connected to one end of said inductive device, means connected between said collector and the other end of said load for applying a negative voltage to said collector, means for applying a negative bias to said emitter said last named means including a diode, means for biasing said diode in its "zener" region, means for applying a positive pulse to said emitter to drive said transistor into saturation and an output means connected to the junction of said load and said inductive device.

References Cited in the file of this patent

UNITED STATES PATENTS

| | | |
|---|---|---|
| 2,594,336 | Mohr | Apr. 29, 1952 |
| 2,655,608 | Valdes | Oct. 13, 1953 |
| 2,683,809 | Fromm | July 13, 1954 |
| 2,691,074 | Eberhard | Oct. 5, 1954 |
| 2,703,368 | Wrathall | Mar. 1, 1955 |
| 2,801,338 | Keller | July 30, 1957 |
| 2,806,964 | Spades et al. | Sept. 17, 1957 |
| 2,820,145 | Wolfendale | Jan. 14, 1958 |
| 2,843,761 | Carlson | July 15, 1958 |
| 2,843,762 | Trent | July 15, 1958 |
| 2,854,589 | Ingham | Sept. 30, 1958 |
| 2,912,596 | Huang | Nov. 10, 1959 |

OTHER REFERENCES

Article entitled "The Transistor Regenerative Amplifier as a Computer Element," by Chapling, Proc. of the Inst. of Elec. Eng., vol. 101, Part III, No. 73, October 1954., pp. 298–307.